United States Patent
Holzapfel et al.

(10) Patent No.: US 8,842,295 B2
(45) Date of Patent: Sep. 23, 2014

(54) SYSTEM HAVING A PLURALITY OF SCANNING UNITS OF A POSITION MEASURING DEVICE

(71) Applicant: Dr. Johannes Heidenhain GmbH, Traunreut (DE)

(72) Inventors: Wolfgang Holzapfel, Obing (DE); Joerg Drescher, Samerberg (DE); Markus Meissner, Uebersee (DE); Ralph Joerger, Traunstein (DE); Bernhard Musch, Otterfing (DE); Thomas Kaelberer, Schrobenhausen (DE)

(73) Assignee: Johannes Heidenhain GmbH, Traunreut (DE)

( * ) Notice: Subject to any disclaimer, the term of this patent is extended or adjusted under 35 U.S.C. 154(b) by 0 days.

(21) Appl. No.: 13/760,409

(22) Filed: Feb. 6, 2013

(65) Prior Publication Data

US 2013/0208287 A1 Aug. 15, 2013

Related U.S. Application Data

(60) Provisional application No. 61/597,323, filed on Feb. 10, 2012.

(30) Foreign Application Priority Data

Feb. 10, 2012 (DE) .......... 10 2012 002 520

(51) Int. Cl.
| | | |
|---|---|---|
| G01B 11/14 | (2006.01) | |
| H01L 21/68 | (2006.01) | |
| G01B 11/00 | (2006.01) | |
| G03F 7/20 | (2006.01) | |
| H01L 21/67 | (2006.01) | |
| G01D 5/347 | (2006.01) | |

(52) U.S. Cl.
CPC .......... *G01B 11/002* (2013.01); *G01D 5/34746* (2013.01); *H01L 21/681* (2013.01); *G03F 7/70775* (2013.01); *H01L 21/67259* (2013.01)
USPC .......................... 356/614; 356/615; 356/616

(58) Field of Classification Search
CPC .. G01D 5/34715; G01B 11/026; G01B 11/00; G03F 7/70733; G03F 7/70783; G03F 9/7049
See application file for complete search history.

(56) References Cited

U.S. PATENT DOCUMENTS

| | | | |
|---|---|---|---|
| 7,515,281 B2 | 4/2009 | Loopstra et al. | |
| 7,573,581 B2 | 8/2009 | Holzapfel | |
| 7,602,489 B2 | 10/2009 | Van Der Pasch et al. | |
| 2009/0051895 A1* | 2/2009 | Shibazaki ........................ 355/72 |
| 2009/0190110 A1 | 7/2009 | Shibazaki | |

FOREIGN PATENT DOCUMENTS

| | | |
|---|---|---|
| EP | 1 762 828 | 3/2007 |
| EP | 1 826 615 | 8/2007 |

* cited by examiner

*Primary Examiner* — Michael P Stafira
(74) *Attorney, Agent, or Firm* — Kenyon & Kenyon LLP (57) ABSTRACT

In a system for detecting the position of an object in relation to a reference system, the object is arranged so as to be movable in relation to the reference system along at least two orthogonal first and second main movement axes. To record the position of the object in relation to the reference system, a position measuring device includes at least two two-dimensional measuring standards situated along the first main movement axis, and four scanning units for an optical scanning of these measuring standards. In addition, at least four additional supplementary scanning units are provided, which are situated between the four scanning units along the first main movement axis.

11 Claims, 5 Drawing Sheets

SYSTEM HAVING A PLURALITY OF SCANNING UNITS OF A POSITION MEASURING DEVICE

CROSS-REFERENCE TO RELATED APPLICATIONS

The present application claims the benefit of U.S. Provisional Patent Application No. 61/597,323, filed on Feb. 10, 2012, and claims priority to Application No. 10 2012 002 520.3, filed in the Federal Republic of Germany on Feb. 10, 2012, each of which is expressly incorporated herein in its entirety by reference thereto.

FIELD OF THE INVENTION

The present invention relates to a system having a plurality of scanning units of a position measuring device.

BACKGROUND INFORMATION

In machines that are used in the production and testing of semiconductor components, for example, it is often necessary to position objects very accurately. It may be necessary, for instance, to position wafers underneath a tool, an exposure unit, or an inspection unit with the utmost precision. The wafer lies on a table that can be moved with six degrees of freedom via a corresponding drive. In other words, it is the table that is used as object whose position in relation to a reference system is to be recorded with the highest precision, while a stationary reference frame of the machine is used as reference system. To position the table via the drive and an associated control unit, it is necessary to generate position signals regarding the spatial position of the table in relation to the reference frame by high-precision position measuring devices.

Machines of this kind predominantly use interferometers as high-precision position measuring devices, but may also use grating-based optical position measuring devices. If grating-based optical position measuring devices are used, it is possible, for example, to place a single or multiple scanning unit(s) on the movable table, while a suitable measuring standard is situated on the reference frame. If this requires a position detection along two orthogonal main movement axes of the table, then the required measuring standard is arranged as a two-dimensional measuring standard in the form of a so-called cross grating. Problems arise if the table is moved across a relatively large range of traverse along one of the main movement axes, since correspondingly large, two-dimensional measuring standards are required in such a case. However, with increasing size, their production becomes much more complicated.

To avoid the production of very large two-dimensional measuring standards, it is conventional to use multiple individual two-dimensional measuring standards or cross grating plates, in order to thereby provide a larger measuring range. The individual two-dimensional measuring standards are then placed next to each other on the reference frame, along the particular main movement axis/axes. A corresponding system is described in U.S. Pat. No. 7,602,489, for example, which is expressly incorporated herein in its entirety by reference thereto. A total of four cross grating plates or two-dimensional measuring standards is mounted on the reference frame in a square arrangement, in order to cover the measuring range. For the optical scanning, a total of four scanning units is provided on the side of the object that is movable along two orthogonal main movement axes. The scanning gratings of the four scanning units are rotated at +/−45° in relation to the two main movement axes, the four scanning units more or less being situated in the corners of a square. The extension of this square corresponds to about the spatial extension of a single two-dimensional measuring standard. When the machine is in operation, defined switchovers take place between the different scanning units in order to ensure that no positional information will be lost when traveling across transition points between adjacent measuring standards. In order to also make it possible to detect the orientation of the table in addition to determining the position of the table along the two main movement axes, position values of at least three scanning units having two axes in each case must always be available simultaneously. The maximum range of traverse along a main movement axis in such a system corresponds to the overall extension of the adjacently situated cross grating plates along this main movement axis, minus the distance of the scanning units along this main movement axis.

In the system described in U.S. Pat. No. 7,602,489, a further increase in the range of traverse of the movable object along at least one of the two main movement axes would require further two-dimensional measuring standards or cross grating plates to be positioned along this main movement axis, or else these cross grating plates would have to have larger dimensions. However, both variants would require a much greater outlay for the overall system.

SUMMARY

Example embodiments of the present invention provide a system having a plurality of scanning units of a position measuring device, which allows a high-precision position detection of an object, the object being movable along two orthogonal main movement axes. In so doing, the object is displaceable along a main movement axis by a range of traverse that is greater than the extension of the scanned measuring standard along this particular main movement axis.

The system according to an example embodiment of the present invention includes an object that is situated so as to be movable in relation to a reference system along at least two orthogonal first and second main movement axes. It also includes a position measuring device for detecting the position of the object in relation to the reference system, which device has at least two two-dimensional measuring standards disposed along the first main movement axis, and four scanning units for optically scanning the measuring standards. The position measuring device includes at least four additional supplementary scanning units for the position detection, which are situated along the first main movement axis, between the four scanning units.

The maximum distance of the outer scanning units along the first main movement axis may correspond to the length of one of the measuring standards along the first main movement axis.

The distance of the inner supplementary scanning units along the first main movement axis may be smaller than the distance of the outer scanning units along the first main movement axis.

It may be provided that the maximum distance of the scanning units and also the supplementary scanning units along the second main movement axis corresponds to the length of the measuring standards along the second main movement axis.

A maximum range of traverse along the first main movement axis may satisfy the relationship:

$$V = 2 \cdot DM_y - DA_{y2};$$

in which V represents the maximum range of traverse along the first main movement axis, $DM_y$ represents the length of the measuring standards along the first main movement axis, and $DA_{y2}$ represents the distance of the supplementary scanning units along the first main movement axis.

The use of the scanning units and the supplementary scanning units allows a continuous position detection along this range of traverse.

It is possible to place the four scanning units and the four supplementary scanning units on one side of the object.

In addition, it may be provided that at least two additional two-dimensional measuring standards are situated along the second main movement axis, adjacent to the at least two two-dimensional measuring standards situated along the first main movement axis.

In this case, the minimum distance of the scanning units and the supplementary scanning units along the second main movement axis may correspond to the sum of the distance of the two two-dimensional measuring standards along the second main movement axis and the length of the measuring standards along the second main movement axis.

The scanning units and the supplementary scanning units may include a one-dimensional scanning grating in each case, and the scanning units as well as the supplementary scanning units may be positioned such that the graduation lines of the associated scanning gratings are rotated by +45° or −45° in relation to the first main movement axis.

Two scanning units and two supplementary scanning units may be situated on one side of an axis of symmetry that is oriented parallel to the second main movement axis, these scanning units and these supplementary scanning units being positioned such that the graduation lines of the associated scanning gratings are rotated by +45° in relation to the first main movement axis. Two further scanning units and two further supplementary scanning units are situated on the other side of the axis of symmetry, these scanning units and these supplementary scanning units being positioned such that the graduation lines of the associated scanning grating are rotated by −45° rotation in relation to the first main movement axis.

For the position detection, individual scanning units and/or supplementary scanning units may be configured to allow an optional activation.

Instead of increasing the extension and/or the number of two-dimensional measuring standards in order to enlarge the measuring range, the number of utilized scanning units may be increased by at least four additional supplementary scanning units, and an enlargement of the measuring range may be accomplished via a suitably selected placement of the scanning units and the supplementary scanning units. This constitutes a clearly less complex approach when compared to possibly using additional or larger two-dimensional measuring standards for this purpose.

Further features and aspects of example embodiments of the present invention are described in more detail below with reference to the appended Figures.

BRIEF DESCRIPTION OF THE DRAWINGS

FIG. 1b is a schematic partial view of a two-dimensional measuring standard and of two scanning units of the system illustrated in FIG. 1a.

DETAILED DESCRIPTION

Figure 1A:
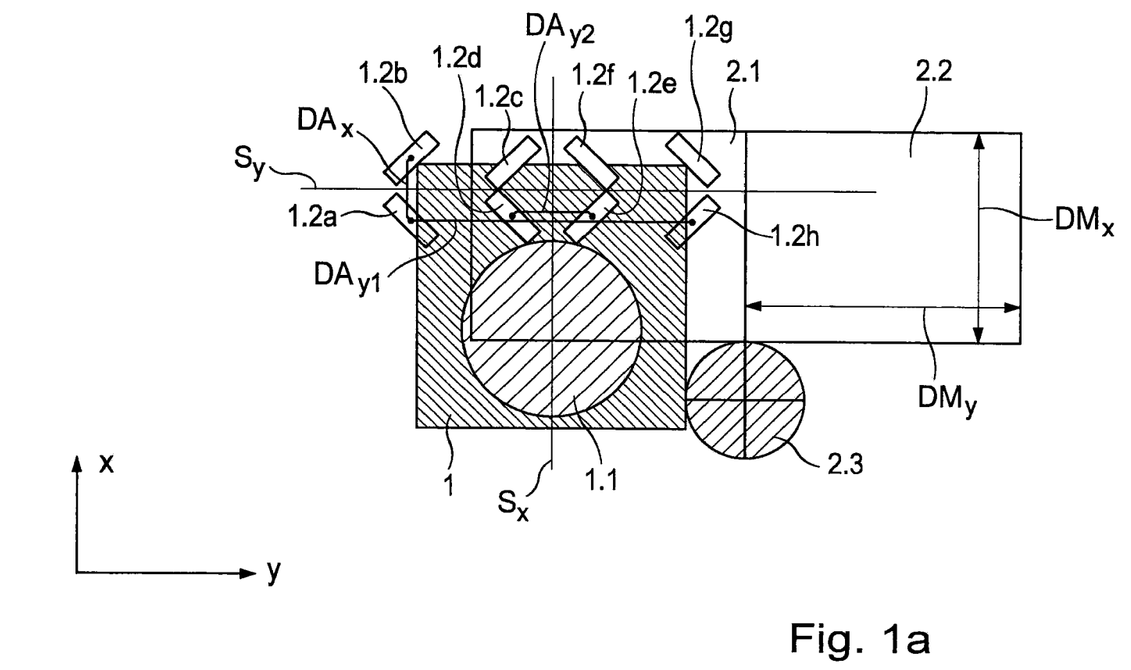
FIG. 1a schematically illustrates a system according to an example embodiment of the present invention.

A system according to an example embodiment of the present invention is described with reference to FIGS. 1a, 1b, and 2. FIGS. 3a to 3d illustrate a processing operation with the respect to the system illustrated in FIGS. 1a, 1b, and 2. These Figures show only the components that are needed for an understanding of the system and do not show the details of a corresponding machine in which such a system may be used. For instance, this may be a machine which is used for the production of semiconductors or for the inspection of semiconductors.

The system is utilized to detect a position of a movable object 1 in relation to a reference system. Object 1, for example, may be a table in the machine, which is situated so as to be movable along the two orthogonal main movement axes x, y. A wafer 1.1, which is to be processed and/or inspected, is situated on the table. The main movement axis denoted by reference letter y in the Figures will be called the first main movement axis in the following text, while reference letter x denotes a second main movement axis, which has an orthogonal orientation with respect to first main movement axis y. The two main movement axes y, x describe a movement plane in the machine, within which the table or object 1 must be positioned in a defined manner during the processing or inspection. As a rule, object 1 is also movable along a third axis which is oriented perpendicularly to the two main movement axes x, y, but this is of no further importance in the present context.

Processing tool 2.3 is situated opposite movable object 1 in a fixed reference system, which is arranged as a reference frame of the machine, for instance. Two identical, two-dimensional measuring standards 2.1, 2.2, mechanically coupled to processing tool 2.3, are situated in the reference system which is stationary with respect to object 1. In the exemplary embodiment illustrated, both two-dimensional measuring standards 2.1, 2.2 are situated next to each other along first main movement axis y. The individual length or extension of measuring standards 2.1, 2.2 along first main movement direction y will be denoted by $DM_y$ in the following text, and the length along second main movement axis x will be denoted by $DM_x$.

The two two-dimensional measuring standards 2.1, 2.2 are arranged as cross grating plates and have two grating graduations, oriented perpendicularly to each other, in the form of incident light diffraction gratings. A first grating graduation includes scale-division marks $T_y$ situated periodically in the y-direction. A second grating graduation, which is superposed to the first grating graduation, includes scale-division marks $T_x$ situated periodically in the x-direction, as this is indicated in an enlarged schematic view of two-dimensional measuring standard 2.1 in FIG. 1b. The two grating graduations may have graduation periods in the range of 2.048 μm.

In addition, a total of eight scanning units 1.2a to 1.2h are situated on the side of movable object 1, which are used for the optical scanning of two-dimensional measuring standards 2.1, 2.2 and the generation of position signals. In addition to four outer scanning units 1.2a, 1.2b, and 1.2g, 1.2h, at least four inner additional supplementary scanning units 1.2c, 1.2d, 1.2e, 1.2f are provided. Via the optical scanning of measuring standards 2.1, 2.2, position signals are generated regarding the movement of object 1 or the table having wafer 1.1 in relation to the reference system having processing tool 2.3, while the machine is in operation and made available to a machine control for further processing. Additional details of suitable optical scanning are described, for example, in European Published Patent Application No. EP 1 762 828 A2, which is expressly incorporated herein in its entirety by reference thereto.

Figure 1B:
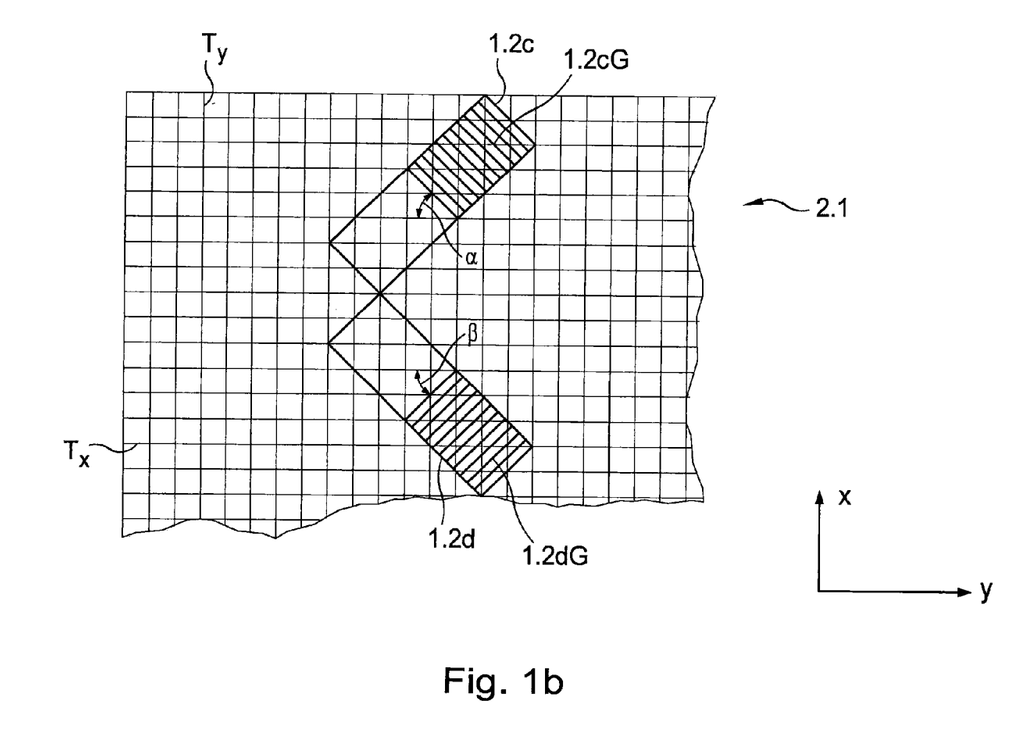
Figure 2:
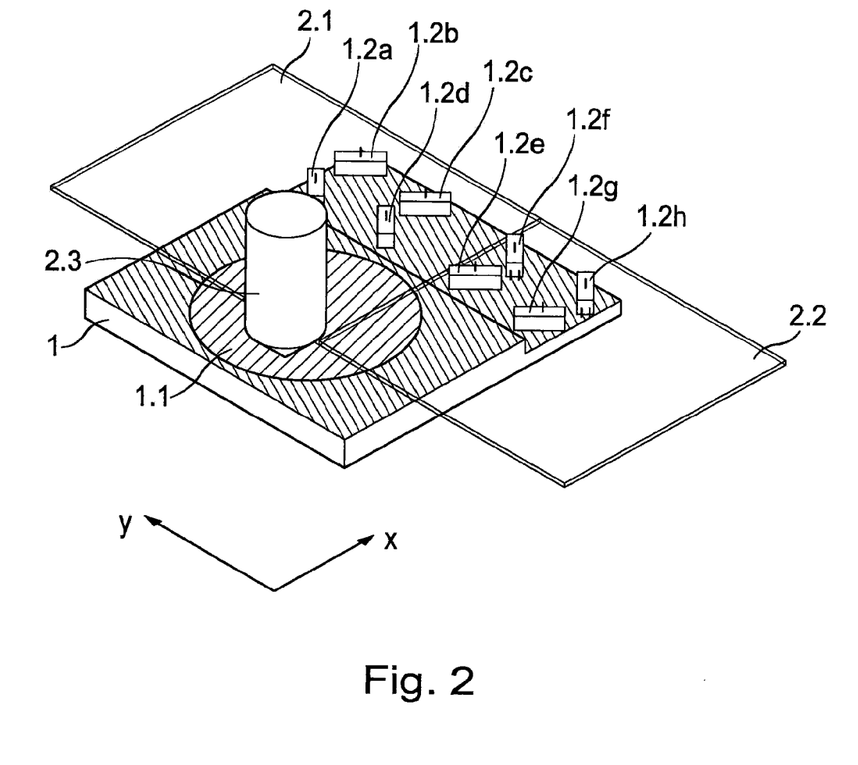
FIG. 2 is a schematic perspective view of the system illustrated in FIGS. 1a and 1b.

As a rule, scanning units 1.2a, 1.2b, 1.2g, 1.2h and also supplementary scanning units 1.2c, 1.2d, 1.2e, 1.2f include various optical components to generate the position signals, among them also a one-dimensional scanning grating 1.2dG, 1.2cG, as illustrated in FIG. 1b in connection with the two supplementary scanning units 1.2c, 1.2d. One-dimensional scanning gratings 1.2dG, 1.2cG include scale division marks situated periodically along one direction. In the exemplary embodiment illustrated, the scale division marks of scanning gratings 1.2dG, 1.2cG are rotated at an angle α=+45° or β=−45° in relation to first main movement axis y. When object 1 is displaced along first main movement axis y, the use of scanning units or supplementary scanning units arranged in this manner makes it possible to generate high-resolution incremental position signals regarding the relative movement taking place in this direction. At the same time, due to the rotated placement of scanning gratings 1.2dG, 1.2cG, additional incremental scanning signals are produced which may be used for other purposes.

As illustrated in FIG. 1a, both the four outer scanning units 1.2a, 1.2b, 1.2g, 1.2h and the four supplementary scanning units 1.2c, 1.2d, 1.2f, 1.2h are disposed in mirror symmetry with a first axis of symmetry $S_y$, which is oriented parallel to first main movement axis y. Furthermore, the four outer scanning units 1.2a, 1.2b, 1.2g, 1.2h and also the four supplementary scanning units 1.2c, 1.2d, 1.2f, 1.2h are likewise disposed in mirror symmetry with a second axis of symmetry $S_x$, which is oriented parallel to second main movement axis x.

Two scanning units 1.2a, 1.2b and two supplementary scanning units 1.2c, 1.2d are situated on one side (left) of second axis of symmetry $S_x$, which is oriented parallel to second main movement axis x. These scanning units 1.2a, 1.2b and supplementary scanning units 1.2c, 1.2d are arranged such that the graduation lines of the associated scanning gratings have an orientation that is rotated by +45° in relation to first main movement axis y. The two other scanning units 1.2g, 1.2h and supplementary scanning units 1.2e, 1.2f are on the other side (right) of this second axis of symmetry $S_x$. These scanning units 1.2g, 1.2h and supplementary scanning units 1.2c, 1.2f are arranged such that the graduation lines of the associated scanning gratings have an orientation that is rotated by −45° in relation to first main movement axis y.

In this example embodiment of the system, both the four outer scanning units 1.2a, 1.2b, 1.2g, 1.2h and the four inner supplementary scanning units 1.2c, 1.2d, 1.2f, 1.2h are substantially situated on one side of object 1, i.e., the table, that is to say, on the side that is pointing upward in FIG. 1a. Such an arrangement allows a compact configuration of the overall system, especially a compact design of the table along second main movement direction x. Furthermore, in contrast to conventional systems, only two two-dimensional measuring standards 2.1, 2.2 are necessary for the required range of traverse along first main movement axis y.

In addition, it is provided that outer scanning units 1.2a, 1.2b and 1.2g, 1.2h extending along first main movement direction y have a maximum distance from each other that corresponds to length $DM_y$ of a measuring standard 2.1, 2.2.

In the exemplary embodiment illustrated, precisely this maximum distance is chosen, i.e., distance $DA_{y1}$ of outer scanning units 1.2a, 1.2b and 1.2g, 1.2h is chosen by $DA_{y1}=DM_y$. In this case, however, it is also possible to select a smaller distance $DA_{y1}$ between outer scanning units 1.2a, 1.2b and 1.2g, 1.2h.

In addition, i.e., between the four outer scanning units 1.2a, 1.2b and 1.2g, 1.2h, another at least four additional supplementary scanning units 1.2c, 1.2d, 1.2e, 1.2f are provided in the system. They are situated along first main movement axis y, between the four outer scanning units 1.2a, 1.2b and 1.2g, 1.2h. The four supplementary scanning units 1.2c, 1.2d, 1.2e, 1.2f lying on the inside have a distance $DA_{y2}$ along first main movement axis y, which distance is selected smaller than above distance $DA_{y1}$ of outer scanning units 1.2a, 1.2b, 1.2g, 1.2h.

Scanning units 1.2a, 1.2b, 1.2g, 1.2h situated on both sides of axis of symmetry S, and supplementary scanning units 1.2c, 1.2d, 1.2e, 1.2f all have the same distance $DA_x$ along second main movement axis x. As a maximum, this distance $DA_x$ may correspond to length $DM_x$ of measuring standards 2.1, 2.2 along second main movement axis x. As illustrated in FIG. 1a, distance $DA_x$ is selected to be clearly smaller than length $DM_x$ of measuring standards 2.1, 2.2 along this direction.

Due to this configuration of the system, the range of traverse of object 1 along first main movement axis y within which a highly precise position detection is possible is able to be enlarged. In a conventional approach, for example, a position detection along the y-axis using only four external scanning units 1.2a, 1.2b, 1.2g, 1.2h would have been possible across a maximum range of traverse $V=2 \cdot DM_y - DA_{y1}$. Using the additionally provided four supplementary scanning units 1.2c, 1.2d, 1.2e, 1.2f, the possible range of traverse of object 1 is able to be increased, without additional or larger measuring standards 2.1, 2.2, to a range of traverse $V=2 \cdot DM_y - DA_{y2}$, since $DA_{y1} > DA_{y2}$, illustrated in FIG. 1a. This increase in the range of traverse will be illustrated in the following text with reference to FIGS. 3a to 3d.

FIGS. 3a to 3d illustrate different stages of a processing operation in a machine for the production of semiconductors, which uses the above-described system for detecting the position of a table. Only four of the total of eight existing scanning units or supplementary scanning units are used for a position detection in the individual stages of this process. As a result, individual scanning units or supplementary scanning units within the system are therefore selectively activatable for the position detection by a control unit. The scanning units and supplementary scanning units activated in the various process stages are marked by dashed lines in FIGS. 3a to 3d.

Figure 3A:
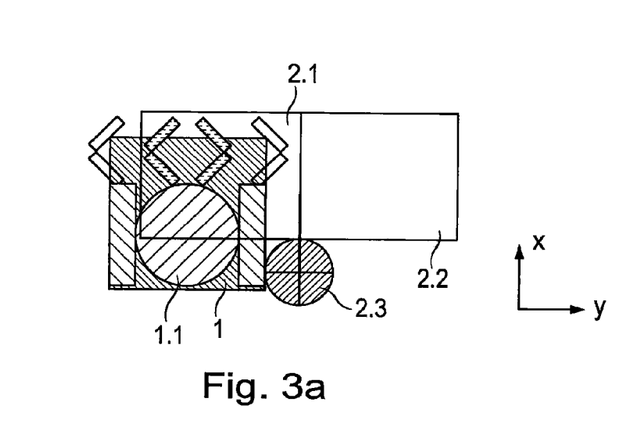
FIGS. 3a to 3d are cross-sectional views of the range of traverse during operation of the system illustrated in FIGS. 1a, 1b, and 2.

FIG. 3a illustrates an acceleration phase of this processing operation, within which object 1, i.e., the table, is moved as rapidly as possible along first main movement axis y, from left to right, close to the particular position in which the processing of wafer 1.1 by processing tool 2.3 is to occur. In this phase the position detection takes place via the four supplementary scanning units situated on the inside, which in this phase continually scan measuring standard 2.1 disposed on the left in FIG. 3a.

Figure 3B:
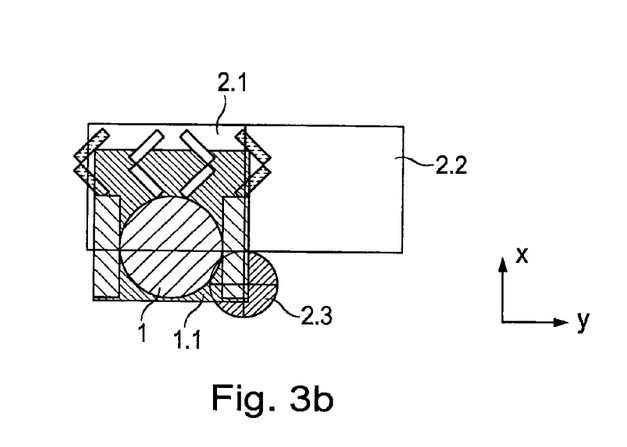

FIG. 3b illustrates the beginning of the measuring phase once the desired object position in the vicinity of the processing position has been reached. In the measuring phase the position of object 1 is detected with high precision via the four scanning units lying on the outside, while wafer 1.1 is processed simultaneously. During this phase, the four scanning units lying on the outside are activated and scan the two measuring standards 2.1, 2.2 in order to generate position signals. Because of the selected distance of the outer scanning units, it is ensured that a position signal from the superposed control unit will be available at all times even if the transition point between the two measuring standards 2.1, 2.2 is crossed. During this measuring phase, the four inner supplementary scanning units may be used for other purposes, for example, for carrying out calibration measurements, etc.

Figure 3C:
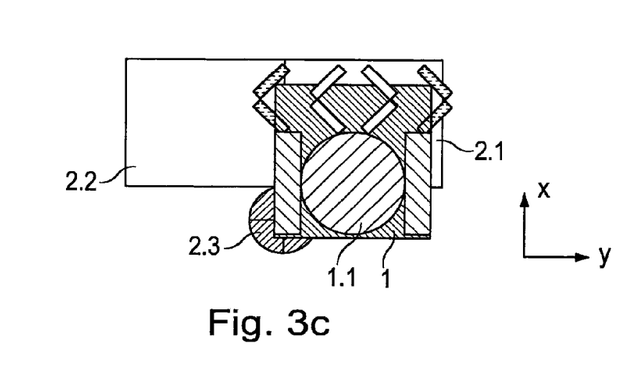

FIG. 3c illustrates the end of the measuring phase of the processing operation. In this case, object 1 has been moved a little farther toward the right along first main movement axis y. In this phase too, the high-precision position detection takes place via the four outer scanning units which are still situated above the two measuring standards 2.1, 2.2. Position measurements for other purposes may continue to be undertaken via the four supplementary scanning units.

Figure 3D:
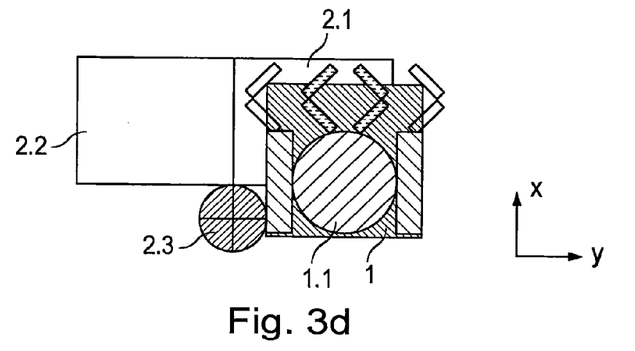

In conclusion, FIG. 3d illustrates a final deceleration phase of the processing operation in which object 1 is moved even farther to the right. In this phase, the position of object 1 is recorded via the four supplementary scanning units, which are activated again.

As can be gathered from this description of a processing operation and the associated figures, the system makes it possible to detect a position along a range of traverse V across an area that is greater than length $DM_y$ of the two measuring standards 2.1, 2.2 along this main movement axis y. As explained earlier, an enlarged range of traverse $V=2 \cdot DM_y - DA_{y2}$ results using the system described herein.

In addition to the activation process for the individual scanning units or supplementary scanning units described with reference to FIGS. 3a to 3d, alternative switchover variants during a processing operation are also possible in connection with the system. In an acceleration phase according to FIG. 3a, for example, it is also possible to use one pair of the supplementary scanning units together with one pair of the scanning units for a position determination. While still accelerating, the supplementary scanning units may then be connected in full for the position detection. During the measuring operation, the position would once again be recorded by the outer scanning units, and the supplementary scanning units would be connected during the following deceleration operation. At the end of the deceleration phase, the position detection could finally take place again via one pair of the supplementary scanning units and one pair of the scanning units. Employing all maximally possible scanning units according to the outlined alternative procedure is advantageous, for example, in order to obtain reduced position noise in the generated position signals. As a result, different variants for utilizing the system and especially for activating and using the different scanning units or supplementary scanning units are able to be provided.

Figure 4:
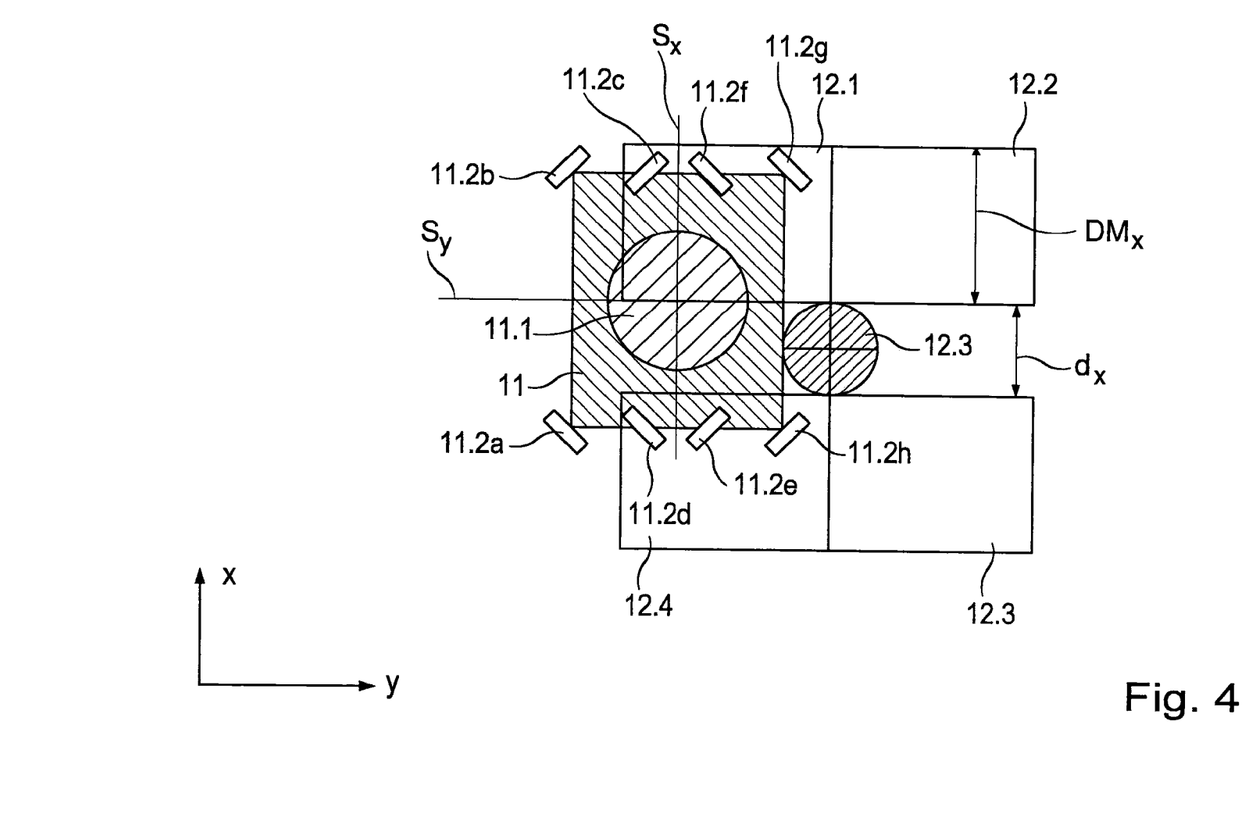
FIG. 4 is a schematic cross-sectional view of a system according to an example embodiment of the present invention.

A system according to another example embodiment of the present invention is explained with reference to FIG. 4. Only the significant differences from the above-described example embodiment of the system will be discussed in the following text.

The significant difference from the above-described example embodiment is that four two-dimensional measuring standards 12.1-12.4, in a square arrangement, are provided. Processing tool 12.3 is situated in the center in relation to the four measuring standards 12.1 to 12.4. In addition to the two measuring standards 12.1, 12.2 located along first main movement axis y, two additional measuring standards 12.3, 12.4 are provided, which are placed along second main movement axis x, adjacent to the two former measuring standards 12.1, 12.2. All four employed measuring standards 12.1 to 12.4 have an identical configuration as far as their dimensions and the incident light diffraction gratings situated thereon are concerned.

Another difference, which results from the use of four two-dimensional measuring standards in this case, is a slightly modified placement of the four outer scanning units 11.2a, 11.2b, 11.2g, 11.2h and the four inner supplementary scanning units 11.2c, 11.2d, 11.2e, 11.2f. While the position of second axis of symmetry $S_x$ is selected to be identical to the previous example embodiment, first axis of symmetry $S_y$ lies precisely in the center of object 11. This means that the two scanning units 11.2b, 11.2g and the two supplementary scanning units 11.2c, 11.2f are situated on one side of object 11, and the two scanning units 11.2a, 11.2h and the two supplementary scanning units 11.2d, 11.2e are situated on the other, opposite side of object 11, i.e., the table. The afore-discussed distance conditions thus apply without change to the distances of scanning units 11.2a, 11.2b, 11.2g, 11.2h and supplementary scanning units 11.2c, 11.2d, 11.2e, 11.2f along first main movement axis y. However, other conditions result for the distances along second main movement axis x. For instance, the minimum distance of scanning units 11.2a, 11.2b, 11.2g, 11.2h and also of supplementary scanning units 11.2c, 11.2d, 11.2e, 11.2f along second main movement axis x corresponds to the sum of distance $d_x$ of two-dimensional measuring standards 12.1 to 12.4 along second main movement axis x and length $DM_x$ of measuring standards 12.1 to 12.4 along second main movement axis x. It is impossible to select a smaller distance of scanning units 11.2a, 11.2b, 11.2g, 11.2h and supplementary scanning units 11.2c, 11.2d, 11.2e, 11.2f along second movement axis x than such a minimum distance if it is to be ensured that a position signal is able to be generated in each object position in relation to measuring standards 12.1 to 12.4.

In such a variant of the system, larger dimensions of object 11 or the table result over all along second main movement axis x. If this is acceptable for the particular application, the advantage of this example embodiment is that the table may then have a symmetrical configuration. This may have an advantageous effect on the dynamics of the overall system.

Variations of the above-described exemplary embodiments of position measuring devices and systems may be provided without departing from the spirit and scope hereon. For example, the second-described example embodiment may be modified such that no distance is provided between the two-dimensional measuring standards along second main movement axis x. In such a configuration, a suitable clearance for the tool would have to be provided in the two-dimensional measuring standards. Moreover, it is possible to provide a defined distance along first main movement axis y, in order to thereby increase the available range of traverse even further, as the case may be. In addition, it is also possible to use more than four supplementary scanning units, etc.

What is claimed is:
1. A system comprising an object movable in relation to a reference system along at least two orthogonal first and second main movement axes; and
    a position-measurement device adapted to detect a position of the object in relation to the reference system, the position-measurement device including:
    at least two two-dimensional measuring standards;
    at least four first scanning units adapted to optically scan the measuring standards;
    at least four additional supplementary scanning units arranged along the first main movement axis between the four first scanning units;

wherein at least one of the first scanning units is arranged along the first main movement axis at a first location, at least one of the first scanning units is arranged along the first main movement axis at a second location, at least one of the additional supplementary scanning units is arranged along the first main movement axis at a third location, and at least one of the additional supplementary scanning units is arranged along the first main movement axis at a fourth location;

wherein the third location and the fourth location are located in between the first location and the second location, the third location and the fourth location being spaced apart in a direction of the first main movement axis;

wherein at least one of the first scanning units is arranged along the first main movement axis at a fifth location, at least one of the first scanning units is arranged along the first main movement axis at a sixth location, at least one of the additional supplementary scanning units is arranged along the first main movement axis at a seventh location, and at least one of the additional supplementary scanning units is arranged along the first main movement axis at an eighth location; and wherein the seventh location and the eighth location are located in between the fifth location and the sixth location, the seventh location and the eighth location being spaced apart in a direction of the first main movement axis.

2. The system according to claim 1, wherein a maximum distance of the first scanning units along the first main movement axis in each case corresponds to length of one of the measuring standards along the first main movement axis.

3. The system according to claim 2, wherein a distance of the inner supplementary scanning units along the first main movement axis is smaller than the distance of the first scanning units along the first main movement axis.

4. The system according to claim 1, wherein a maximum distance of the first scanning units and of the supplementary scanning units along the second main movement axis corresponds to a length of the measuring standards along the second main movement axis.

5. The system according to claim 1, wherein a maximum range of traverse along the first main movement axis satisfies the relationship:

$$V = 2 \cdot DM_y - DA_{y2};$$

wherein V represents the maximum range of traverse along the first main movement axis, $DM_y$ represents a length of the measuring standards along the first main movement axis, and $DA_{y2}$ represents a distance of the supplementary scanning units along the first main movement axis; and wherein a continuous position detection along the range of traverse is possible by the first scanning units and the supplementary scanning units.

6. The system according to claim 1, wherein the four first scanning units and the four supplementary scanning units are arranged on one side of the object.

7. The system according to claim 1, further comprising at least two additional two-dimensional measuring standards arranged along the second main movement axis, adjacent to the at least two two-dimensional measuring standards arranged along the first main movement axis.

8. The system according to claim 7, wherein a minimum distance of the first scanning units and the supplementary scanning units along the second main movement axis corresponds to a sum of the distance of the two-dimensional measuring standards along the second main movement axis and a length of the measuring standards along the second main movement axis.

9. The system according to claim 1, wherein the first scanning units and the supplementary scanning units each include a one-dimensional scanning grating, and the first scanning units and the supplementary scanning units are arranged such that graduation lines of associated scanning gratings are rotated at +45° or −45° in relation to the first main movement axis.

10. The system according to claim 9, wherein:
two first scanning units and two supplementary scanning units are arranged on one side of an axis of symmetry oriented parallel to the second main movement axis and are arranged such that the graduation lines of the associated scanning gratings are rotated by +45° in relation to the first main movement axis; and
two first scanning units and two supplementary scanning units are arranged on the other side of the axis of symmetry and are arranged such that the graduation lines of the associated scanning gratings are rotated by −45° in relation to the first main movement axis.

11. The system according to claim 1, wherein individual first scanning units and/or supplementary scanning units are selectively activatable for a position detection.

* * * * *